(12) United States Patent
Altunyurt et al.

(10) Patent No.: US 9,105,635 B2
(45) Date of Patent: Aug. 11, 2015

(54) STUBBY PADS FOR CHANNEL CROSS-TALK REDUCTION

(71) Applicant: INTEL CORPORATION, Santa Clara, CA (US)

(72) Inventors: Nevin Altunyurt, Dearborn, MI (US); Tolga Memioglu, Chandler, AZ (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/801,998

(22) Filed: Mar. 13, 2013

(65) Prior Publication Data

US 2014/0264907 A1    Sep. 18, 2014

(51) Int. Cl.
     *H01L 23/498*      (2006.01)
     *H01L 23/522*      (2006.01)
     *H01L 23/66*      (2006.01)

(52) U.S. Cl.
CPC ...... *H01L 23/5226* (2013.01); *H01L 23/49822* (2013.01); *H01L 23/49827* (2013.01); *H01L 23/49833* (2013.01); *H01L 23/66* (2013.01); *H01L 2224/16237* (2013.01); *H01L 2224/16265* (2013.01); *H01L 2224/16267* (2013.01); *H01L 2924/0002* (2013.01)

(58) Field of Classification Search
CPC .................. H01L 23/49822; H01L 23/49827; H01L 23/49833; H01L 2224/16265; H01L 2224/16237; H01L 2224/16267
USPC ............................ 326/1, 5; 257/786, 698, 778
See application file for complete search history.

(56) References Cited

U.S. PATENT DOCUMENTS

| | | | |
|---|---|---|---|
| 5,847,936 A * | 12/1998 | Forehand et al. | 361/794 |
| 7,106,610 B2 * | 9/2006 | Fahmy et al. | 365/63 |
| 7,239,213 B2 * | 7/2007 | Dreps et al. | 333/1 |
| 8,093,910 B2 * | 1/2012 | Schmatz et al. | 324/628 |
| 8,772,783 B2 * | 7/2014 | Hirosue et al. | 257/72 |
| 2004/0021215 A1 * | 2/2004 | Zhong et al. | 257/691 |
| 2009/0004902 A1 * | 1/2009 | Pandey et al. | 439/331 |
| 2009/0115049 A1 * | 5/2009 | Shiraishi et al. | 257/698 |
| 2012/0068339 A1 * | 3/2012 | Miller et al. | 257/738 |
| 2013/0161836 A1 * | 6/2013 | Yeom et al. | 257/778 |
| 2014/0203175 A1 * | 7/2014 | Kobrinsky et al. | 250/214.1 |

\* cited by examiner

*Primary Examiner* — Phat X Cao
(74) *Attorney, Agent, or Firm* — Blakely, Sokoloff, Taylor & Zafman LLP

(57) ABSTRACT

A metal surface feature, such as a pad, terminating a vertical transition through a substrate, such as an IC package substrate, includes one or more stubs providing high edge surface area to couple with one or more complementary stubs on an adjacent metal surface feature to provide a desired amount of mutual capacitance that may at least partially cancel crosstalk for an overall channel crosstalk (e.g., FEXT) reduction. In embodiments, capacitive coupling of adjacent pads is provided for more than two pads to achieve crosstalk reduction of more than one victim-aggressor pair and/or to achieve crosstalk reduction of more than two aggressors. In embodiments, the pads have a large pitch (e.g., 1000 μm) suitable for interfacing to an interposer or PCB socket, while the gap between the stubs is small (e.g., 15 μm), as limited only by the minimum spacing allowed for metal features on the opposite side of the package employed for interfacing to the IC.

19 Claims, 4 Drawing Sheets

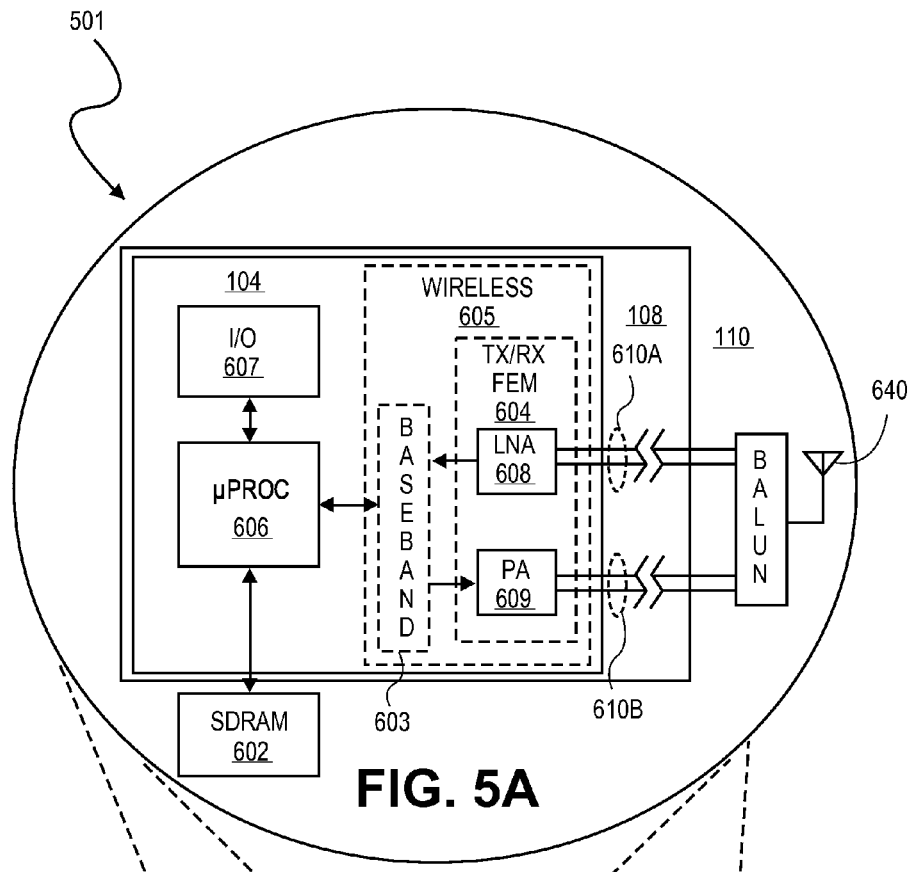
FIG. 5A
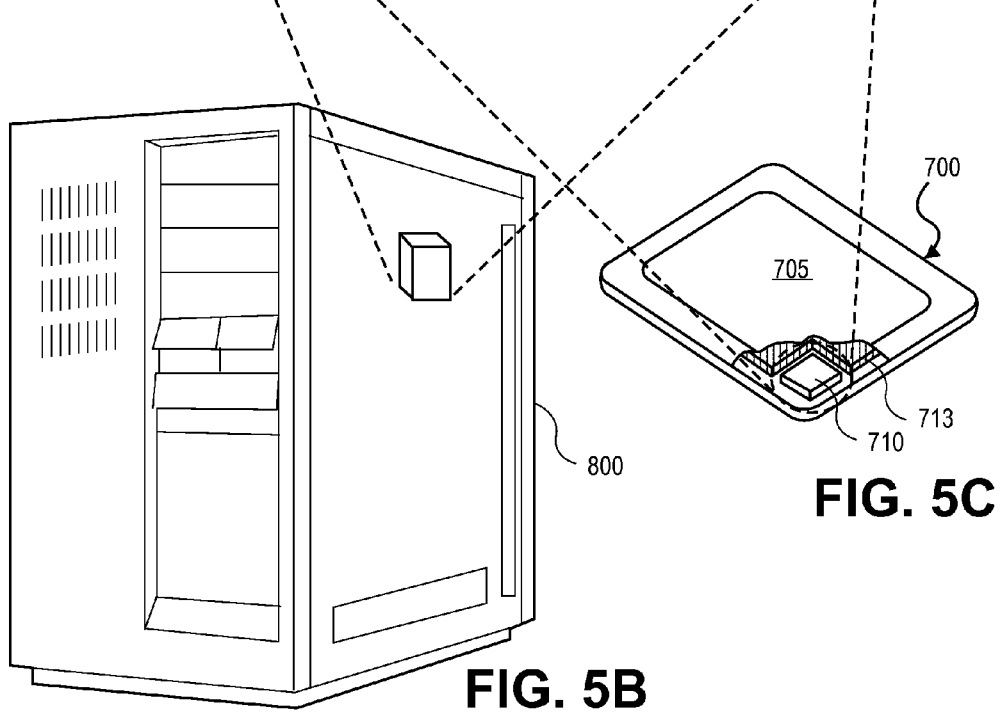
FIG. 5B
FIG. 5C

1 …

STUBBY PADS FOR CHANNEL CROSS-TALK REDUCTION

TECHNICAL FIELD

Embodiments of the present invention generally pertain to integrated circuits, and more particularly to routing paths for conveying integrated circuit (IC) I/O channels off-chip.

BACKGROUND

High speed signaling poses significant challenges with respect to signal loss between an IC operable within a high frequency range, and off-chip terminals, such as a dynamic random access memory (DRAM) interface, or an antenna for wireless applications. The cumulative path of a signal channel between the IC chip and off-chip signal origin/designation generally includes a package of the IC, and may further include an interposer on which the packaged IC is affixed, and/or a circuit board on which the IC or interposer is affixed. Horizontal interconnect routing for a given communication channel in the IC package, and/or interposer, and/or board responsible for carrying such high speed signals may include a transmission line circuit for containing the electromagnetic wave as it is propagated. Such transmission lines are often in the form of a stripline, microstrip, or coplanar waveguide (CPW) circuit. Vertical interconnect routing for a given channel may include, for example, plated through holes (PTHs) and micro vias in a package substrate, socket pins/lands, and PTHs in a motherboard.

Crosstalk between channels occurs when a signal transmitted on one channel of a transmission system creates an undesired effect in another channel and may be caused by one or more of capacitive, inductive, or conductive coupling between the channels. Interference between two channels as measured at an end of a path opposite from that of the transmitter is referred to as far end crosstalk (FEXT) and, assuming proper termination and non-interleaved routing, is typically more problematic than near end crosstalk (NEXT) measured at the transmitter end of the path. Overall channel crosstalk, which is often predominantly FEXT, remains a problem in high data bandwidth applications (e.g., exceeding 2.0 Gbyte/sec), and can be the bandwidth limiter, particularly for single-ended channels. For example, induced FEXT voltage may cause propagation delay between even and odd mode signals, causing FEXT-induced jitter reducing data eye openings and limiting channel bandwidth.

Crosstalk from vertical transitions and horizontal microstrip routing are often both inductively dominant. As such, to maintain acceptable I/O performance, conventional I/O channel architectures may either employ conservative signal to ground (S:G) ratios in vertical transitions and/or stripline architectures in horizontal routing to mitigate crosstalk. Such techniques however disadvantageously increase pin count and layer count, respectively.

BRIEF DESCRIPTION OF THE DRAWINGS

Embodiments of the present invention are illustrated by way of example, and not limitation, in the figures of the accompanying drawings in which:

FIG. 5A is a functional block diagram of a system employing signal lines with overlapping vertical transitions to reduce signal transmission crosstalk, in accordance with an embodiment;

FIG. 5B is an isometric view of a server machine employing the system of FIG. 5A, in accordance with an embodiment; and FIG. 5C is an isometric view of a mobile computing device employing the system of FIG. 5A, in accordance with an embodiment.

DETAILED DESCRIPTION

Figure 1A:
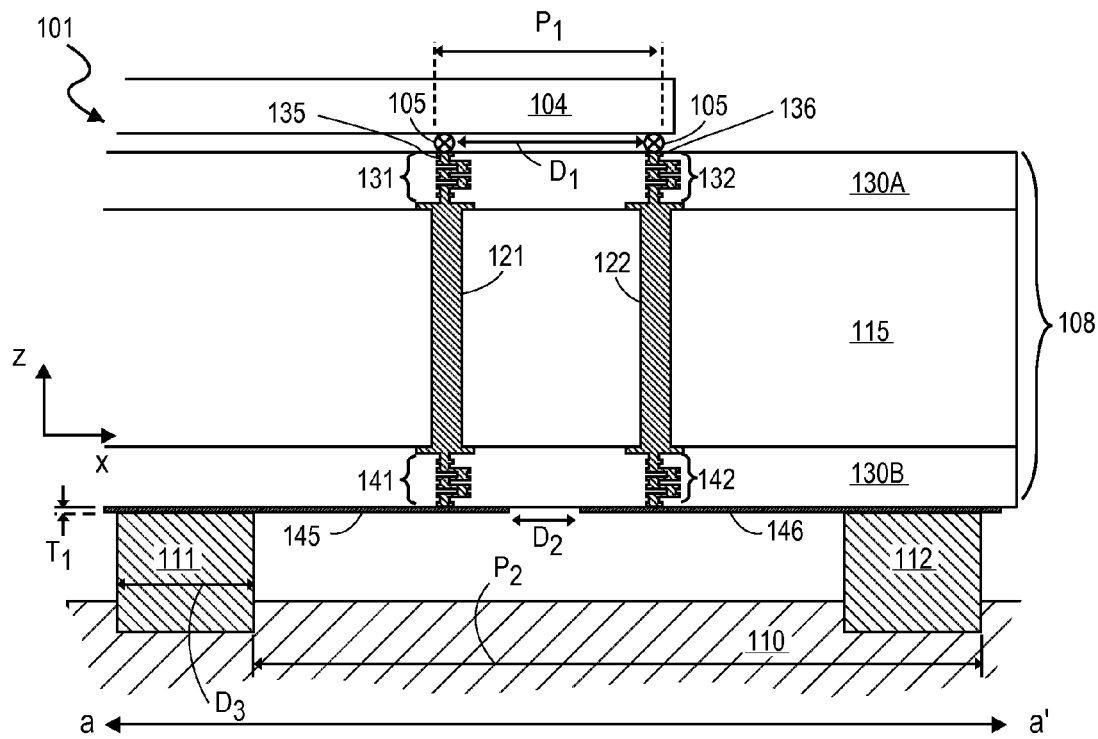
FIG. 1A is a cross-sectional view of off-chip vertical transitions employed in I/O signal routing paths to tune capacitive coupling of channels susceptible to crosstalk, in accordance with an embodiment of the present invention.

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not structurally or functionally exclusive of the other.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause an effect relationship).

Generally, embodiments described herein achieve a reduction in overall crosstalk between I/O channels of an IC through a cancellation technique in which mutual capacitive coupling of adjacent metal pad termini of vertical transitions through a substrate included in off-chip routing and its ratio to self capacitive coupling are controllably increased. As one example, decomposition of a DDR4 channel implemented by an IC chip indicates a package substrate, interposer between the chip and a host board, board socket to interposer (or board socket to package substrate if there is no interposer), and the DIMM connector on the board hosting a DRAM memory chip are all significant crosstalk contributors, particularly FEXT. IC I/O channels may be either single-ended or differential pairs with typically over one half of the I/Os for many ICs, including certain DDR implementations, being single-ended. FEXT for any single-ended channel is a function of the mutual capacitive and inductive coupling:

$$FEXT \propto \frac{C_m}{C} - \frac{L_m}{L},$$

where $C_m$ is the mutual capacitance, C is the self-capacitance, $L_m$ is the mutual inductance and L is the self-inductance. Vertical transitions in a substrate, such as a package substrate, are usually implemented with micro-vias or mechanically drilled PTH vias. The crosstalk of these vertical transitions is inductively dominant such that FEXT is less than zero. This may also be true for transmission lines, such as a microstrip, employed in the channel along horizontal transitions/routes. Therefore, in the time domain the overall channel FEXT often has negative polarity (i.e., negative for a rising edge excitation).

The ratio of the mutual capacitance over the self-capacitance ($C_m/C$) associated with certain vertical transmissions within a package substrate may be tuned to have a less negative, or even positive polarity for a rising edge excitation. Because the channel FEXT can be treated as the cumulative effect from all components, vertical transitions may be configured with a desired amount of "overly-capacitive" mutual coupling to compensate for the inductive coupling (e.g., originating between adjacent signal lines passing through the substrate) and at least partially cancel crosstalk for an overall channel crosstalk reduction. For example, changing certain vertical transitions from inductive to capacitive dominant (i.e., changing polarity) may help to cancel inductive dominant FEXT from other channel components, such as, but not limited to a motherboard via, socket, or microstrip routing. Increased mutual capacitance of adjacent vertical transitions within a substrate achieved by embodiments herein may therefore enable higher I/O density by reducing the number of ground pins (e.g., within byte and/or cross-byte isolation pins), or enable a layer count reduction in the substrate by permitting the use of microstrip routing for horizontal transitions rather than stripline routing or other similarly more layer intensive transmission line designs. Alternatively, or in addition, higher channel data rates, and/or greater voltage or time margin may be achieved with embodiments.

In embodiments, capacitive coupling of adjacent vertical transitions is tuned through the use of stubs on adjacent metal features, such as pads, that terminate the vertical transitions at a surface of a substrate, such as a package substrate. Generally, the perimeter, or edge, length of a first pad adjacent to a second pad associated with a crosstalking signal path is increased through the inclusion of a desired number of stubs having a specific geometry. Capacitive mutual coupling is enhanced by spacing the stubs on the first pad a small distance apart from complementary stubs on the second pad.

FIG. 1A is a cross-sectional view of off-chip vertical transitions employed in I/O signal routing paths to tune capacitive coupling of channels susceptible to crosstalk, in accordance with an embodiment of the present invention. FIG. 1A illustrated a system 101 including an IC chip 104 affixed to a package substrate 108 by first level interconnects (FLIs) 105.

In embodiments, the IC chip 104 (e.g., a processor including one or more logic processing cores) includes a first and second single-ended I/O circuitry (e.g., DDR I/O), each connected to one FLI 105. The package substrate 108 includes a package core 115 with mechanically drilled plated through holes (MTH) 121, 122. On both sides of the core 115 are build up layers 130A, 130B, each of which include a plurality of interconnect metallization layers (e.g., 6-7 metallization layers) separated by intervening dielectric layers (e.g., 5-6 organic layers). In the exemplary embodiment, a first vertical transition through the packaged substrate 108 includes a first metal-filled micro via stack 131 extending through the build-up layer 130A. The via stack 131 ends at a top-side metal feature 135, which connects with the FLI 105. An opposite end the via stack 131 connects to the MTH 121, which further connects to a second micro via stack 141. A second vertical transition passes through the thickness of the substrate 108 adjacently to the first transition. The second vertical transition connects to the FLI 105 and similarly includes a micro via stack 132 with a second top-side metal feature 136, which is coupled to a micro via stack 142 by way of the MTH 122. Notably, the top-side metal feature 135, associated with a first I/O channel is adjacent to the top-side metal feature 136, associated with a second I/O channel. With the first and second transitions through the substrate 108 also being in close proximity, inductive mutual coupling of these vertical transitions may be non-negligible at high bandwidths, but the effect of such on channel signal quality may be mitigated as described herein.

Referring still to FIG. 1A, the micro via stacks 141, 142 end at the surface of the substrate 108 with bottom-side metal features 145, 146, which in the exemplary embodiment are pads (e.g., forming a portion of a land grid array, or LGA). However, in alternative embodiments, the bottom-side metal features 145, 146 terminating the vertical transitions through the package substrate are pins or posts (e.g., forming a portion of a pin grid array, or PGA). Regardless of their form, the bottom-side metal features 145, 146 are adjacent to each other, and may indeed be nearest neighbors in certain embodiments, as a natural consequent of direct vertical transitioning through the substrate 108 (particularly where stacked micro-via technology is employed).

As further depicted in FIG. 1A, second level interconnects (SLI) 111, 112 connect a printed circuit board 110 to the metal features 145, 146, respectively. In certain embodiments, SLI 111, 112 entails a socket that is configured to mate with the metal features 145, 146 (e.g., LGA socket, PGA socket, etc.). The first and second top-side metal features 131, 132 are separated by a distance $D_1$ and are also associated with a feature pitch $P_1$. Likewise, the first and second bottom-side metal features 145, 146 are spaced apart by a distance $D_2$ and have a feature pitch, $P_2$, as depicted in FIG. 1A. Notably, the spacing $D_1$ is a much greater fraction of the pitch $P_1$ than is the spacing $D_2$ of the pitch $P_2$. While the feature pitch $P_1$ supports the fine feature pitch of the FLI 105, the feature pitch $P_2$ is a function of the pitch capability of the SLI 111, 112 as limited by the interposer or PCB 110. Generally, the pitch $P_1$ is at least one order or magnitude smaller than the pitch $P_2$ and often differs by two orders of magnitude. In embodiments, the pitch $P_2$ is on the order of tens of mils (thousandths of an inch) and in one exemplary LGA embodiment, the pitch $P_2$ is between 20 and 50 mils (i.e., ~500 to ~1250 μm).

As a result of their parallel formation, the build-up layers 130A and 130B are associated with the same feature patterning capability (e.g., pitch and minimum line/space parameters) for the various interconnect/redistribution layers. Thus, the fine pitch and small feature size capability of the top-side metal features 135, 136 for interfacing the package substrate 108 to the (IC) chip 104 are also available to the bottom-side metal features 145, 146. In embodiments, the spacing $D_1$ is on the same order as the spacing $D_2$ and may be substantially the same. For example, where the spacing $D_1$ is on the order of microns (μm), or tens of microns, the spacing $D_2$ is also microns, or tens of microns. In certain such embodiments, where the spacing $D_1$ is 5-50 μm, the spacing of $D_2$ is also between 5-50 μm. Indeed, with the parity between the spacings $D_1$ and $D_2$, the spacing $D_2$ may actually be smaller than the spacing $D_1$ in some embodiments. Although pitches and spacings described herein may be expected to decrease with technological advancement, the general relationship between these dimensions may be maintained.

In embodiments, metal surface features at an end of a vertical transition through a package substrate include capacitive coupling stubs. In embodiments, the high feature fidelity available to the bottom-side metal features 145, 146 is utilized to provide closely spaced, and potentially intricately featured capacitive stubs 155, 165 (FIG. 1B) along at least a portion of the bottom-side metal features 145, 146. As such, some portion of the bottom side metal feature area is utilized for providing greater edge lengths to impart a controlled amount of additional capacitive mutual coupling between the metal features 145, 146. Notably, because the same direct vertical transition routing that imparts an amount of inductive mutual coupling between two adjacent transitions also ensures the corresponding bottom-side metal features are adjacent, closely spaced surfaces are available for patterning of the capacitive coupling stubs. As shown in FIG. 1A, the bottom-side metal features 145 may have a large horizontal, or lateral dimension (e.g., x-dimension) relative a somewhat smaller SLI 111, 112 dimension $D_3$ (e.g., a pin diameter), so capacitive coupling stubs may be designed at one or more perimeter portion with sufficient tolerances so as to not interfere SLI connections made more proximate to a metal feature edge opposite the stub(s). As such, embodiments may employ existing SLI technology and/or feature pitches.

Figure 1B:
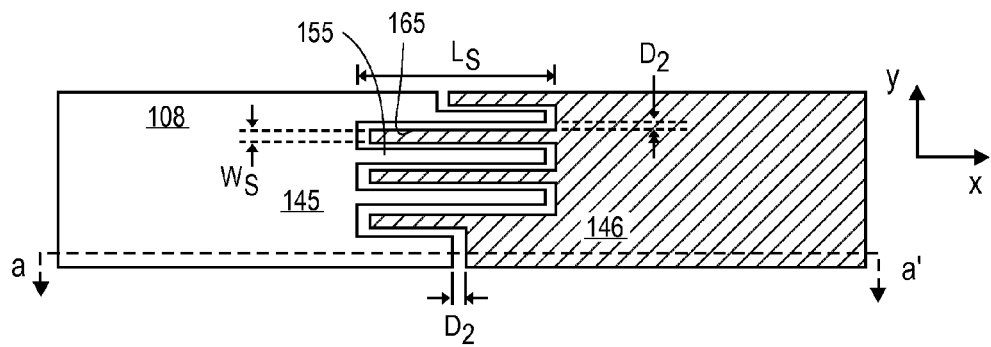
FIG. 1B is a plan view of substrate pads for separate I/O channels and large capacitively coupled area, in accordance with embodiments of the present invention.

In embodiments, the capacitive coupling stubs on a first metal feature have edges complementary to coupling stubs on a second, adjacent metal feature. FIG. 1B is a plan view of the bottom-side metal features 145, 146, in accordance with embodiments. As shown, the stubs 155 extending off the feature 145 are interdigitated with stubs 165 extending off the feature 146, such that edges of one stub 155 are complementary to a edges of a pair of stubs 165. The complementary stubs increase the perimeter surface area of the metal feature edge that is proximate (adjacent) to the other. Generally, the stubs provide capacitive coupled edges extending in both x and y dimension (with the z-dimension of the stubs being a function of the thickness of the features 145, 146). Capacitive coupling area between two adjacent metal features is then a function of the number of stubs, the geometry of each stub (e.g., length of stub, $L_s$, width of stub, $W_s$, thickness of stub) and the spacing distance $D_2$ between complementary stub surfaces.

In embodiments, coupling stubs have an edge length in a second dimension (e.g., x-dimension in FIG. 1B) that is at least two times the edge length extending in a first dimension (e.g., y-dimension in FIG. 1B), advantageously at least four times, and more advantageously at least ten times the edge length extending in a first dimension (e.g., y-dimension in FIG. 1B). In further embodiments, coupling stubs have a narrowest dimension (e.g., width $W_s$ in FIG. 1B) that is on the same order as the spacing between stubs of adjacent metal features (e.g., $D_2$ in FIG. 1B). In one exemplary embodiment, $W_s$ is approximately the same as $D_2$ (e.g., both between 5 and 50 μm). In further embodiments, coupling stubs have a longest dimension (e.g., length $L_s$ in FIG. 1B) that is at least twice, advantageously at least four time, an more advantageously at least ten times the spacing between stubs of adjacent metal features (e.g., $D_2$).

In embodiments, to provide high capacitance per stub, the spacing between stubs, distance $D_2$ in FIGS. 1A, 1B, is made small. In embodiments, the distance $D_2$ is less than 10% of the feature pitch $P_2$, advantageously less than 5% of the feature pitch $P_2$, and more advantageously less than 2% of the feature pitch P2. Thus, for one exemplary embodiment where $P_2$ is between 30 and 50 mils, complementary stubs may be spaced apart by 5-50 μm along the entire lengths (and widths) of the stubs. Indeed, as process capability improves, spacing between stubs of adjacent metal features may be further reduced. The thickness of the coupling stubs, being a function of the build-up process, may vary. In exemplary embodiments where $D_1$ and $D_2$ are 5-50 μm, the thickness of coupling stubs ($T_1$ in FIG. 1A) is 5-30 μm.

Figure 2A:
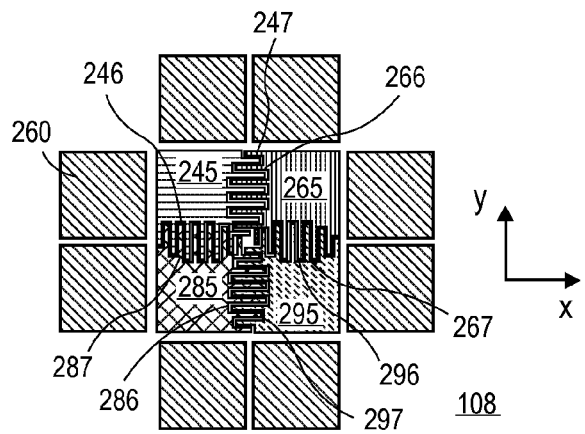
FIG. 2A is a plan view of substrate pads for four separate I/O channels with stubby pads, in accordance with embodiments of the present invention.

In embodiments, capacitive coupling of adjacent pads is provided to achieve crosstalk reduction of more than one victim-aggressor pair and/or to achieve crosstalk reduction of more than two aggressors. FIG. 2A is a plan view of substrate pads 245, 265, 285, and 295, corresponding four separate I/O channels. A similar configuration is also possible for pins in a PGA substrate, or any other metal feature terminating a vertical transition. The metal pads 245, 265, 285, and 295 are surrounded by a plurality of ground lines 260. One or more such ground lines may be utilized, but with the exemplary architecture cross-talk is limited to within the I/O channels by the ground lines 260. Thus, one or more of the four I/O channels may have a crosstalk victim-aggressor relationship and in the exemplary embodiment, each nearest neighbor would have a crosstalk victim-aggressor relationship that is inductive dominant within a package substrate absent the capacitive coupling stubs on each of the pads. As shown, the (first) pad 245 includes (first) stubs 247 interdigitated with a complementary (second) stubs 266 extending off the adjacent (second) pad 265. The pad 265 further includes stubs 267 that are interdigitated with stubs 296 extending off the adjacent (third) pad 295. Similarly, the pad 295 further includes stubs 297 that are interdigitated with stubs 286 extending off the (fourth) adjacent pad 285. Finally, the pad 285 further includes stubs 287 that are interdigitated with (fifth) stubs 246 extending off the pad 245. The ground line pads 260 lack any coupling stubs. Thus, for these four adjacent pads, nearest neighbors have enhanced capacitive mutual coupling which may be engineered to mitigate any enhanced inductive coupling associated with the corresponding four I/O channels, either resulting from the vertical transition through the substrate (in which the same nearest neighbor status depicted in FIG. 2B may be maintained), or from anywhere else along the length of the I/O channel (e.g., within a socket on an interposer or PCB 110).

Figure 2B:
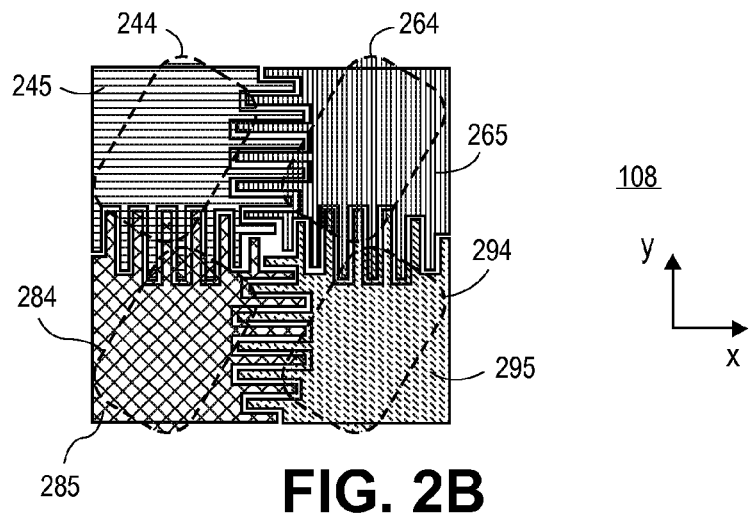
FIG. 2B is a plan view of substrate pads for four separate I/O channels with stubby pads overlaying a conventional pad layout for comparison.
Figure 3:
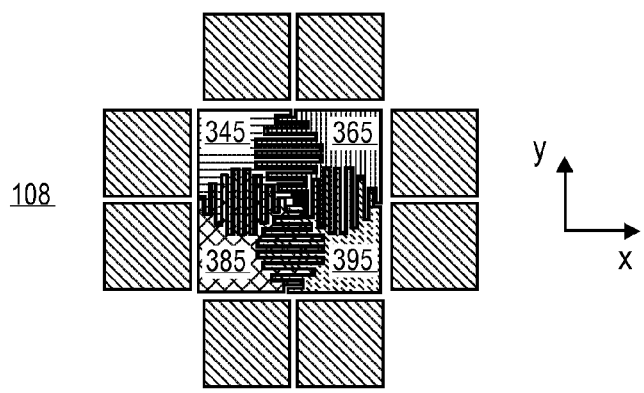
FIG. 3 is a plan view of substrate pads with large capacitively coupled stubby pads, in accordance with embodiments of the present invention.

FIG. 2B is a plan view of substrate pads for four separate I/O channels with stubby pads overlaying a conventional pad layout for comparison. Generally, FIG. 2B is an expanded view of the stubby pad layout depicted in FIG. 2A with the non-stubby pads 244, 264, 284 and 294 outlined in dashed line. As shown, the addition of the coupling stubs encroaches very little on the non-stubby pad area and the area of the stubby pads 245, 265, 285 and 295 may be made substantially the same as that of the non-stubby pad with little impact to overall substrate area occupied by the group signal line pads. Depending on the dimensions and tolerances associated with the SLI (e.g., $D_3$ an $P_2$ in FIGS. 1A, 1B), more or less pad area may be dedicated to coupling stubs to achieve more or less mutual capacitance. FIG. 3 is a plan view of substrate pads 345, 365, 385, and 395 with longer stubs, in accordance with embodiments of the present invention. Mutual capacitive coupling may be tuned be adjusting the stub geometry in the manner illustrated by FIG. 3. With the pads 345, 365, 385 and 395 sharing the same layout and total substrate area as the pads depicted in FIG. 2A, the coupling stubs are relatively larger than those for the pads 245, 265, 285, and 295. For example, stubs occupy approximately one half of the area of the pad 345 as opposed to approximately 25% of the pad 245.

Figure 4A:
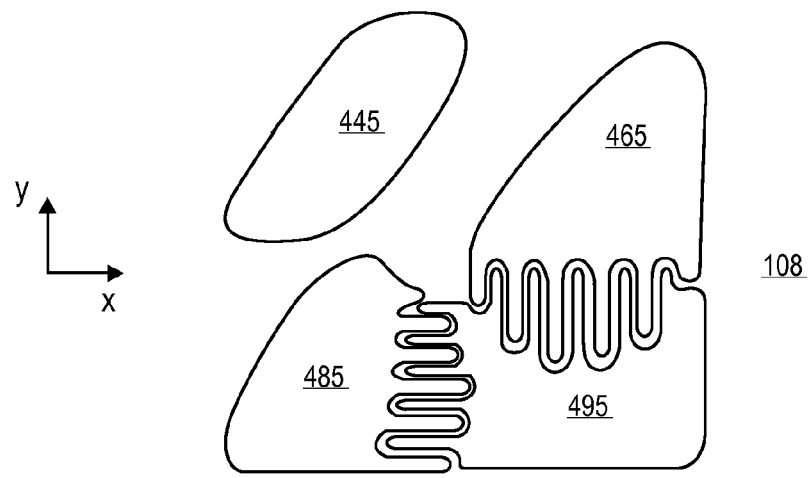
FIGS. 4A, 4B, and 4C are plan views of stubby pads to tune capacitive coupling of channels susceptible to crosstalk, in accordance with embodiments.

In embodiments, only a subset of all vertical transitions terminates on metal features including capacitive coupling stubs. One or more signal I/O channel pads may have more or less coupling stub area than another signal I/O channel pad, as a function of the victim-aggressor relationship for a given set of lines. Just as for the ground line pads 260, signal lines not victimized or aggressing upon another may have no stubs at all. FIG. 4A is plan views of stubby pads to tune capacitive coupling of channels susceptible to crosstalk, in accordance with an embodiment where coupling stub coupling area is varied within a subset of pads associated with separate I/O channels. As shown, pad 445 terminating a vertical transition that is spaced farther away from other vertical transitions (e.g., those terminated by pads 465, 485 and 495) is lacking capacitive coupling stubs while the pad 495 has the greatest stub edge length (i.e., highest additional capacitive area).

Figure 4B:
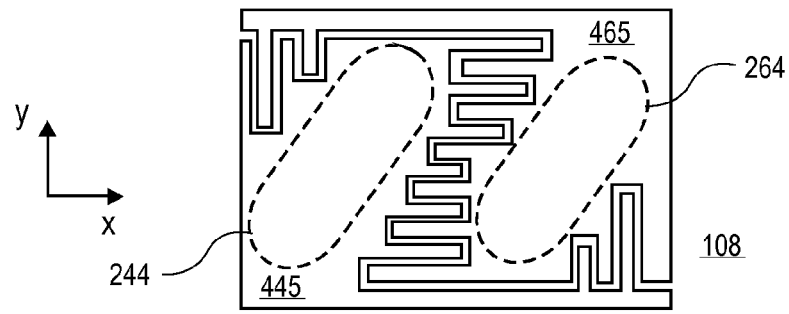
Figure 4C:
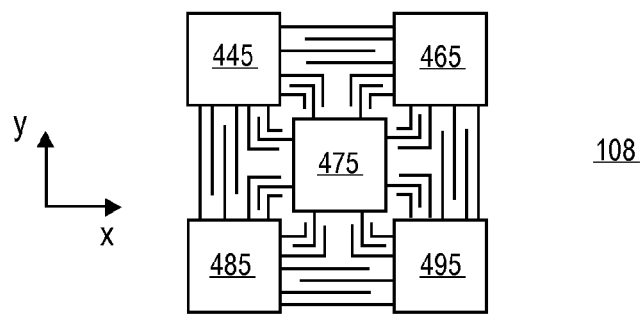

FIGS. 4B, and 4C are plan views of stubby pads to tune capacitive coupling of channels susceptible to crosstalk, in accordance with other embodiments to further illustrate how coupling stubs may be provided as a function of the crosstalk victim-aggressor relationship of a given subset of I/O channels. In FIG. 4B, where there is only a pair of I/O channels with the minimal victim-aggressor relationship, multiple sides of the pads 445 and 465 may be utilized for coupling stubs. The dotted line 244, 264 illustrate stub-free regions reserved for SLI connections, and as shown, the stubs for one pad extend along opposite sides of the stub-free region in the other pad. In FIG. 4C, there is a victim-aggressor relationship among a subset of five I/O channels with stubs present between each of the pads 445, 465, 475, 485, and 495. Thus, whether a pair, a set of three, four, five, or more, pad repeatable units may be provided with enhance capacitive coupling through the addition of coupling stub structures.

FIG. 5A is a functional block diagram of a system employing signal lines with overlapping vertical transitions to reduce signal transmission crosstalk, in accordance with an embodiment. FIG. 5B is an isometric view of a server machine employing the system of FIG. 5A, in accordance with an embodiment. FIG. 5C is an isometric view of a mobile computing device employing the system of FIG. 5A, in accordance with an embodiment. Reference numbers in FIGS. 5A, 5B, and 5C are deliberately the same as those used elsewhere herein for those elements/components that may have any of the features previously described in the context of that same reference number.

Referring to FIG. 5A, in one exemplary embodiment the IC chip 104 includes the logic processor core 606, and may be for example a central processing unit (CPU). In an exemplary embodiment, at least one alternate input/output (I/O) interface 607 (e.g., USB, SATA, PCIe, etc.) couples to a memory 602 (e.g., DDR SDRAM) further provided in the system 501 (e.g., on the motherboard 110). In other embodiments, the IC chip 104 is a system-on-a-chip (SoC) including the wireless (RF) module 605 as well as at least one logic processor core 606 (i.e., an applications processor of the system 501). The RF or wireless module 605 is shown in dashed line because it need not be present in all embodiments, although such a module may be found in desktop and server embodiments as well as the more typical mobile device embodiments. The wireless module 605 may be of any design known in the art and, more specifically is operable at a frequency of 0.9 GHz, or higher (e.g., 2.4 GHz). The RF module 605 includes an RF signal receiver (Rx), RF signal transmitter (Tx), or RF signal transceiver (Tx/Rx) with a baseband processor 603 and a front end module (FEM) 604 that further includes a low noise amplifier (LNA) 608 on a receiver path and a power amplifier (PA) 609 on a transmit path, as well as filters, mixers, an up-converter to up convert the signal frequency from baseband to RF band, a down-converter to down convert the signal frequency from RF band to baseband, etc., between the baseband processor 603 and antenna 640.

In embodiments, at least one of the memory 602, logic processor core 606, wireless module 605, and alternate I/O interface 607 is electrically coupled to destinations off the IC chip 104 through an embodiment of the vertical transitions capacitively coupled by stubby pads, as described elsewhere herein. For example, a high speed communication link between any two of: the logic processor core 606, memory 602, RF module 605, and alternate I/O interface 607 may be implemented with an embodiment of the vertical transitions capacitively coupled by stubby pads described herein. In one exemplary embodiment where the memory 602 entails a DDR SDRAM (e.g., DDR 4 compliant) connected to the board 110 through a DIMM connector, each byte communicated by the memory 602 to the IC chip 104 (e.g., through a LGA socket coupling the substrate 108 to the PCB 110) contains 8 DQ signals driven by either a single-ended or differential driver. Good crosstalk cancellation can be achieved between the DQ signals with vertical transitions terminated with capacitively coupled stubby pads as described herein. For example, with the crosstalk cancellation techniques described herein, a higher bandwidth connection is possible between the processor core 606 on the IC chip 104 and SDRAM 602 on the board 110.

In another embodiment also illustrated in FIG. 5A, the LNA 608, or a preamplifier, is connected to differential input signal routing 610A which is routed off the IC chip 104 and onto the package substrate 108. From the package substrate, the signal is further routed to an RF signal switch, balun, or a feedline of the antenna 640, for example by routing traces on the PCB 110. An RF signal switch, for example, may include a controlled switch having signal terminals connected to one of the vertical transitions terminated with capacitively coupled stubby pads described herein. In one exemplary embodiment, the LNA input signal routing on the package substrate 108 is implemented with vertical transitions capacitively coupled by stubby pads in conformance with those described elsewhere herein. An analogous transmit path may also be provided with a portion of the on-package transmit path 610B between the PA 609 and the antenna 640 employing an embodiment of the vertical transitions capacitively coupled by stubby pads described herein. In another embodiment where the LNA 608 includes a differential input, vertical transitions terminated with capacitively coupled stubby pads in conformance with the embodiments described herein are implemented with a balanced pair of signal lines that are electrically coupled to the differential input (e.g., a differential driver).

FIG. 5B is an isometric view of a server machine 800 employing the system 501, in accordance with an embodiment. The server machine 800 may be any computing device configured for data processing and include one or more microprocessor IC chips and one or more memory modules (e.g., SDRAM). With the vertical transitions capacitively coupled by stubby pads described herein, the I/O pin density of the microprocessor IC chip may be increased, and/or a higher bandwidth connection made to the memory module.

FIG. 5C is an isometric view of a mobile computing device 700 employing the system 501, in accordance with an embodiment. The mobile computing device or platform 700 may be any portable device configured for each of electronic data display, electronic data processing, and wireless electronic data transmission. For example, the mobile computing device 700 may be any of a tablet, a smart phone, laptop computer, other intent device, etc. and includes a display screen 705, the system 501, and a battery 713. With the vertical transitions capacitively coupled by stubby pads described herein, the form factor of the packaged system 710 can be reduced relative to systems relying only on conventional transmission line circuits or greater numbers of ground lines, etc., enabling the mobile computing device 700 to either have a concomitantly reduced form factor or a greater region within a given device form factor available to the battery 713 for longest operative lifetimes between charging, or available to memory (not depicted), such as a solid state drive for greatest functionality.

This detailed description provides many exemplary embodiments meant to demonstrate one or more technical features. In one example, an integrated circuit (IC) package substrate, comprising: a first conductive vertical transition passing through a thickness of the substrate beginning at a first top-side metal feature on a first substrate side and ending at a first bottom-side metal feature on a second substrate side, opposite the first side; and a second conductive vertical transition passing through the substrate thickness beginning at a second top-side metal feature on the first substrate side and ending at a second bottom-side metal feature on the second substrate side, wherein the perimeters of first and second bottom-side metal features include complementary capacitive coupling stubs.

As a further example, the capacitive coupling stubs comprise a first stub on the first bottom-side metal feature having edges interdigitated with a pair of second stubs on the second bottom-side metal feature.

In another example, the interdigitated edges extend in both a first and second orthogonal dimension with a thickness of the bottom-side metal features in a third dimension, orthogonal to the first and second dimension.

In another example, the first and second bottom-side metal features are associated with a first pitch and a capacitive coupling stub on the first bottom-side metal feature is spaced apart from the capacitive coupling stub on the second bottom-side metal feature by a first distance that is less than 10% of the first pitch.

In another example, the first and second top-side metal features are associated with a second pitch that is at least an order of magnitude smaller than the first pitch, and are spaced apart by a second distance that is the same order of magnitude as the first distance.

In another example, the first distance is between 5 and 50 micrometers (μm), the first pitch is between 20 and 50 mils, and the first and second bottom-side metal features have a thickness of 5-30 μm.

In another example, the first and second transitions are a pair of transitions within a greater plurality of transitions, and each of the greater plurality of transitions include metal features on a surface of the substrate that have capacitive coupling stubs.

In another example, the capacitive coupling stubs comprise a first stub on the first bottom-side metal feature having an edge adjacent to an edge of a second stub on the second bottom-side metal feature; and the plurality of transitions further includes a third bottom-side metal feature on the second substrate side, the third bottom-side metal feature including a capacitive coupling stub adjacent to a third stub on the second bottom side metal feature.

In another example, the plurality of transitions further includes a fourth bottom-side metal feature on the second substrate side, the fourth bottom-side metal feature including a capacitive coupling stub adjacent to a fourth stub on the third bottom-side metal feature and a capacitive coupling stub adjacent to fifth stub on the first bottom-side metal feature.

In another example, the greater plurality of transitions further includes a conductive vertical transition spaced farther away from the first transition than is the second transition, and terminating with a metal feature lacking any capacitive coupling stubs.

In one exemplary integrated circuit (IC) package substrate, there are a plurality of signal lines adjacent to one another and extending through a thickness of the substrate; and one or more ground line adjacent to at least one of the plurality of signal lines and extending through the thickness of the substrate. Each of the plurality of signal lines terminate at surface pads that include capacitive coupling stubs interdigitated with stubs of at least one other adjacent pad, and the ground line terminates at a surface pad that has no capacitive coupling stubs.

In another example, the first and second bottom-side metal features are associated with a first pitch and wherein the capacitive coupling stubs on the first bottom-side metal feature are spaced apart from the capacitive coupling stubs on the second bottom-side metal feature by a first distance that is less than 10% of the first pitch.

In one exemplary computing platform, there is any of the exemplary IC package substrates above and an integrated circuit (IC) including a first signal I/O connected to the first top-side metal feature and a second signal I/O connected to the second top-side metal feature.

In another exemplary computing platform an interposer or printed circuit board (PCB) is physically connected to the first and second bottom-side metal features with complementary socket features having approximately a same pitch as that of the first and second bottom-side metal features.

In another exemplary computing platform, the first and second bottom-side metal features comprise two pads in a land grid array (LGA), the complementary socket features comprise pins extending from a PCB, and the PCB electrically connects the first and second signal I/O to separate channels of a dynamic random access memory (DRAM) socket.

In another exemplary computing platform, the first and second bottom-side metal features comprise two pins in a pin grid array (PGA), the complementary socket features comprise lands disposed on a PCB, and the PCB electrically connects the first and second signal I/O to separate channels of a dynamic random access memory (DRAM) socket.

In an exemplary computer system, there is an integrated circuit (IC) chip comprising at least one logic processor core; a package substrate; and an interposer or printed circuit board (PCB). The package substrate further comprises a first conductive vertical transition passing through a thickness of the substrate beginning at a first top-side metal feature connected to the IC chip and ending at a first bottom-side metal feature connected to the interposer or PCB; and a second conductive vertical transition passing the substrate thickness beginning at a second top-side metal feature connected to the IC chip and ending at a second bottom-side metal feature connected to the interposer or PCB, with the perimeters of first and second bottom-side metal features including capacitive coupling stubs.

In another example, the package substrate is coupled to a PCB through a socket contact, wherein the first and second vertical transitions are to carry crosstalking communication signals to and from the IC that have an aggressor-victim relationship, and wherein the capacitive coupling stubs impart a mutual capacitive coupling between the first and second vertical transitions to reduce the crosstalk.

In another example, the PCB hosts at least one dynamic random-access memory (DRAM), and wherein the crosstalking communication signals are carried by single-ended circuitry coupling the IC to the DRAM.

In another example, the IC chip comprises at least one wireless module, wherein the PCB hosts at balun, and wherein the crosstalking communication signals are carried by differential circuitry coupled to the balun.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. An integrated circuit (IC) package substrate, comprising:
   a first conductive vertical transition passing through a thickness of the substrate beginning at a first top-side metal feature on a first substrate side and ending at a first bottom-side metal feature on a second substrate side, opposite the first side, wherein the first bottom-side metal feature is a first signal I/O channel pad; and
   a second conductive vertical transition passing through the substrate thickness beginning at a second top-side metal feature on the first substrate side and ending at a second bottom-side metal feature on the second substrate side, wherein the second bottom-side metal feature is a second signal I/O channel pad, wherein the perimeters of first and second bottom-side metal features include complementary capacitive coupling stubs, wherein the first and second top-side metal features are associated with a first pitch and the first and second bottom-side metal features are associated with a second pitch, and wherein the first pitch is at least an order of magnitude smaller than the second pitch.

2. The IC package substrate of claim 1, wherein the capacitive coupling stubs comprise a first stub on the first bottom-side metal feature having edges interdigitated with a pair of second stubs on the second bottom-side metal feature.

3. The IC package substrate of claim 2, wherein the interdigitated edges extend in both a first and second orthogonal dimension with a thickness of the bottom-side metal features in a third dimension, orthogonal to the first and second dimension.

4. The IC package substrate of claim 1, wherein a capacitive coupling stub on the first bottom-side metal feature is spaced apart from the capacitive coupling stub on the second bottom-side metal feature by a first distance that is less than 10% of the second pitch.

5. The IC package substrate of claim 4, wherein the first and second top-side metal features are spaced apart by a second distance that is the same order of magnitude as the first distance.

6. The IC package substrate of claim 4, wherein the first distance is between 5 and 50 micrometers (μm), wherein the first pitch is between 20 and 50 mils, and wherein the first and second bottom-side metal features have a thickness of 5-30 μm.

7. The IC package substrate of claim 1, where the first and second transitions are a pair of transitions within a greater plurality of transitions, and each of the greater plurality of transitions include metal features on a surface of the substrate that have capacitive coupling stubs.

8. The IC package substrate of claim 7, wherein the capacitive coupling stubs comprise a first stub on the first bottom-side metal feature having an edge adjacent to an edge of a second stub on the second bottom-side metal feature; and
   wherein the plurality of transitions further includes a third bottom-side metal feature on the second substrate side, the third bottom-side metal feature including a capacitive coupling stub adjacent to a third stub on the second bottom side metal feature.

9. An integrated circuit (IC) package substrate, comprising:
   a first conductive vertical transition passing through a thickness of the substrate beginning at a first top-side metal feature on a first substrate side and ending at a first bottom-side metal feature on a second substrate side, opposite the first side; and
   a second conductive vertical transition passing through the substrate thickness beginning at a second top-side metal feature on the first substrate side and ending at a second bottom-side metal feature on the second substrate side, wherein the perimeters of first and second bottom-side metal features include complementary capacitive coupling stubs, and where the first and second transitions are a pair of transitions within a greater plurality of transitions, and each of the greater plurality of transitions include metal features on a surface of the substrate that have capacitive coupling stubs, wherein the capacitive coupling stubs comprise a first stub on the first bottom-side metal feature having an edge adjacent to an edge of a second stub on the second bottom-side metal feature, and wherein the plurality of transitions further includes a third bottom-side metal feature on the second substrate side, the third bottom-side metal feature including a capacitive coupling stub adjacent to a third stub on the second bottom side metal feature, and wherein the plurality of transitions further includes a fourth bottom-side metal feature on the second substrate side, the fourth bottom-side metal feature including a capacitive coupling stub adjacent to a fourth stub on the third bottom-side metal feature and a capacitive coupling stub adjacent to fifth stub on the first bottom-side metal feature.

10. The IC package substrate of claim 8, wherein the greater plurality of transitions further includes a conductive vertical transition spaced farther away from the first transition than the second transition, and terminating with a metal feature lacking any capacitive coupling stubs.

11. An integrated circuit (IC) package substrate, comprising:

a plurality of signal lines adjacent to one another each beginning at a top-side metal feature and extending through a thickness of the substrate; and one or more ground line adjacent to at least one of the plurality of signal lines and extending through the thickness of the substrate; wherein each of the plurality of signal lines terminate at surface pads that include capacitive coupling stubs interdigitated with stubs of at least one other adjacent pad, wherein the surface pads are I/O channel pads, and wherein the ground line terminates at a surface pad that has no capacitive coupling stubs, and wherein the top-side metal features are associated with a first pitch and the surface pads that include capacitive coupling stubs are associated with a second pitch, and wherein the first pitch is at least an order of magnitude smaller than the second pitch.

12. The IC package substrate of claim 11, wherein the surface pads are associated with a first pitch and wherein the capacitive coupling stubs on a first surface pad are spaced apart from the capacitive coupling stubs on a second surface pad by a first distance that is less than 10% of the first pitch.

13. A computing platform, comprising:
the IC package substrate of claim 1; and
an integrated circuit (IC) including a first signal I/O connected to the first top-side metal feature and a second signal I/O connected to the second top-side metal feature.

14. The computing platform of claim 13, further comprising an interposer or printed circuit board (PCB) physically connected to the first and second bottom-side metal features with complementary socket features having approximately a same pitch as that of the first and second bottom-side metal features.

15. The computing platform of claim 14, wherein the first and second bottom-side metal features comprise two pads in a land grid array (LGA), wherein the complementary socket features comprise pins extending from a PCB, and wherein the PCB electrically connects the first and second signal I/O to separate channels of a dynamic random access memory (DRAM) socket.

16. A computer system comprising:
an integrated circuit (IC) chip comprising at least one logic processor core;
a package substrate; and
an interposer or printed circuit board (PCB), wherein the package substrate comprises:
a first conductive vertical transition passing through a thickness of the substrate beginning at a first top-side metal feature connected to the IC chip and ending at a first bottom-side metal feature connected to the interposer or PCB, wherein the first bottom-side metal feature is a first signal I/O channel pad; and
a second conductive vertical transition passing through the substrate thickness beginning at a second top-side metal feature connected to the IC chip and ending at a second bottom-side metal feature connected to the interposer or PCB, wherein the second bottom-side metal feature is a second signal I/O channel pad and, wherein the perimeters of first and second bottom-side metal features include capacitive coupling stubs, and wherein the first and second top-side metal features are associated with a first pitch and the first and second bottom-side metal features are associated with a second pitch, and wherein the first pitch is at least an order of magnitude smaller than the second pitch.

17. The system of claim 16, wherein the package substrate is coupled to a PCB through a socket contact, wherein the first and second vertical transitions are to carry crosstalking communication signals to and from the IC that have an aggressor-victim relationship, and wherein the capacitive coupling stubs impart a mutual capacitive coupling between the first and second vertical transitions to reduce the crosstalk.

18. The system of claim 17, wherein the PCB hosts at least one dynamic random-access memory (DRAM), and wherein the crosstalking communication signals are carried by single-ended circuitry coupling the IC to the DRAM.

19. The system of claim 17, wherein the IC chip comprises at least one wireless module, wherein the PCB hosts at balun, and wherein the crosstalking communication signals are carried by differential circuitry coupled to the balun.

* * * * *